United States Patent [19]

Pissot

[11] Patent Number: 4,578,047

[45] Date of Patent: Mar. 25, 1986

[54] STATION-SELECTING DEVICE FOR A RADIO RECEIVER

[75] Inventor: Guy Pissot, Bressolles, France

[73] Assignee: Thomson-Brandt, Paris, France

[21] Appl. No.: 551,531

[22] Filed: Nov. 14, 1983

[30] Foreign Application Priority Data

Nov. 16, 1982 [FR] France .................... 82 19144

[51] Int. Cl.$^4$ .................. F16D 7/02; F16H 35/18; F16H 55/00
[52] U.S. Cl. .................... 464/30; 74/10 R; 74/10.8; 464/45; 464/182
[58] Field of Search .............. 464/30, 41, 42, 43, 464/45, 46, 179, 182; 74/10 R–10.9

[56] References Cited

U.S. PATENT DOCUMENTS

| | | | |
|---|---|---|---|
| 1,627,592 | 5/1927 | Chamberlain | 74/10 R |
| 1,631,788 | 6/1927 | Bennett | 74/10.45 |
| 1,747,234 | 2/1930 | Geloso | 74/10 R |
| 1,807,995 | 6/1931 | Marvel | 74/10.8 X |
| 2,177,760 | 10/1939 | Wheat | 74/10.8 |
| 2,197,140 | 4/1940 | Arvin | 464/179 |
| 2,203,736 | 6/1940 | Mahnken | 74/10 R |
| 2,409,192 | 10/1946 | Collins | 464/30 |
| 2,513,085 | 6/1950 | Fairbanks | 464/45 X |
| 2,523,032 | 9/1950 | La Flamme | 464/30 X |
| 2,794,920 | 6/1957 | Salmet | 464/30 X |
| 2,814,188 | 11/1957 | Fox | 464/42 |
| 3,064,494 | 11/1962 | Brewster | 74/10 R X |
| 3,146,612 | 9/1964 | Lorenz | 464/30 |
| 3,254,539 | 6/1966 | Ma | 464/30 X |
| 3,789,691 | 2/1974 | Zaugg | 464/30 X |
| 3,930,362 | 1/1976 | Cielaszyk | 464/30 X |
| 4,043,206 | 8/1977 | Narihiro et al. | 464/43 X |

FOREIGN PATENT DOCUMENTS

| | | | |
|---|---|---|---|
| 611044 | 12/1960 | Canada | 464/30 |
| 495722 | 4/1930 | Fed. Rep. of Germany | |
| 801179 | 5/1936 | France | |
| 2312819 | 12/1976 | France | 74/10 R |

Primary Examiner—John Petrakes
Attorney, Agent, or Firm—Pollock, Vande Sande & Priddy

[57] ABSTRACT

A station-selecting device for a radio receiver comprises a rotatable control knob for driving an element of a tuning device which is capable of moving between two end positions. Motion transmission is carried out by applying a coefficient of friction between a shaft which is rigidly fixed to the control knob and a driven member. The coefficient of friction is of sufficiently high value to transmit motion when the moving element is located between its end positions and of sufficiently low value to cause displacement of the shaft in sliding motion against the previously driven member when the moving element reaches the end of travel. The driven member is a cyclindrical journal-bearing in which the shaft is rotatably mounted and which is preferably elastic, at least in the radial direction.

5 Claims, 2 Drawing Figures

U.S. Patent   Mar. 25, 1986   4,578,047
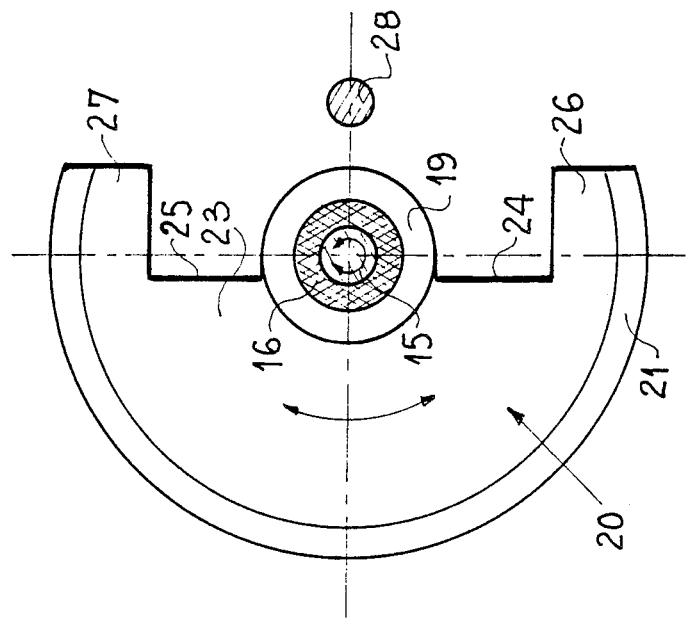
Fig_2
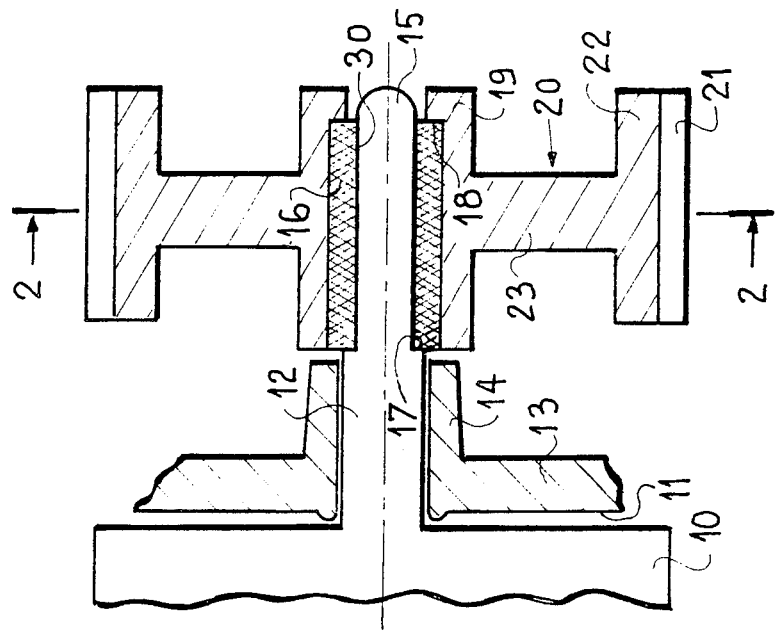
Fig_1

STATION-SELECTING DEVICE FOR A RADIO RECEIVER

BACKGROUND OF THE INVENTION

1. Field of the Invention

The invention relates to a station-selecting device for a radio receiver.

2. Description of the Prior Art

In order to select stations, it has been the usual practice to make use of a capacitor having a capacitance which depends on the position of a moving element such as a metallic strip. This position, and therefore the tuning frequency or in other words the selected station, can be modified by means of a control knob which produces action on said moving element of the capacitor or like tuning device by means of a mechanical linkage. Said moving element is capable of moving only between two end positions, stops being provided for limiting its travel.

In order to prevent any damage to the mechanical linkage between the control knob and the moving element, provision is usually made for means whereby the rotation of the actuating knob is permitted to continue when the moving element has reached the end of travel. The means just mentioned utilize a coefficient of friction which is of sufficiently high value to permit motion transmission but remains of sufficiently low value to permit only sliding motion (without driving in rotation) when the moving element is at the end of travel.

In known devices, friction is set up either between a shaft and a string or between a shaft and the periphery of a wheel. Selecting devices of this type are relatively delicate or fail to offer sufficient reliability to meet current requirements.

SUMMARY OF THE INVENTION

The present invention makes it possible to overcome the disadvantages outlined in the foregoing The distinctive feature of the invention accordingly lies in the fact that the aforementioned coefficient of friction, which is of sufficiently high value to permit motion transmission while nevertheless having a sufficiently low value to prevent said motion transmission when the moving element to be driven has reached the end of travel, is set up between the shaft which is driven by the control knob and a cylindrical member forming a journal-bearing at the center of a wheel.

A device of this type is of extremely simple design and has greater strength than the known devices of the same type which have been employed up to the present time.

In the preferred embodiment of the invention, the journal-bearing is elastic at least in the radial direction. Said journal-bearing accordingly has a double junction: in the first place it has the function mentioned above and, in the second place, it constitutes a safety element for absorbing radial forces and/or for taking up play.

BRIEF DESCRIPTION OF THE DRAWINGS

FIG. 1 is a sectional view of a portion of a selecting device in accordance with the invention.

FIG. 2 is a sectional view taken along line 2—2 of FIG. 1.

DESCRIPTION OF THE PREFERRED EMBODIMENT

As shown in FIG. 1, the station-selecting device for a radio receiver comprises an external control knob 10 on the front face 11 of a radio receiver. This control knob has an extension in the form of a shaft 12 which passes through the front wall 13 and also through a sleeve 14 which projects inwards from said wall on the side remote from the front face 11 proper. The shaft 12 is in turn provided with an extension in the form of a coaxial shaft 15 of smaller diameter which is rotatably mounted in a journal-bearing 16 constituted by a cylindrical sleeve having elastic properties at least in the radial direction.

One axial extremity of the sleeve 16 is applied against the annular shoulder 17 which forms a separation between the shafts 12 and 15 and the other axial extremity of said elastic sleeve 16 is applied against the end wall 18 of a recess provided for said sleeve in the central portion 19 of a member 20 having a generally semi-circular shape. Teeth 21 are formed on the periphery of said semi-circular member 20 and are intended to cooperate with a toothed wheel or toothed rack for driving the moving element of the variable capacitor or tuning capacitor (not shown in the drawings).

The central portion 19 of the member 20 is cylindrical and coaxial with the shafts 12 and 15 as well as the sleeve 16. Said central portion is separated from a peripheral cylindrical portion 22 by a web 23 which is of smaller thickness in the axial direction and occupies substantially a semi-circle. Said web 23 is limited by rectilinear edges 24 and 25 perpendicular to the axis.

The peripheral cylindrical portion 22 terminates in extremities 26 and 27 which project respectively from the edges 24 and 25.

Each edge 24 and 25 is intended to cooperate with a stop 28 which serves to limit the rotational displacement of the member 20 and therefore limits the travel of the moving element of the tuning capacitor.

When the edges 24 and 25 are not in contact with the stop 28, the member 20 is driven in rotation by the control knob 10. On the other hand, when the edge 24 or 25 arrives against the stop 28, the effort exerted on the control knob 10 causes the shaft 15 to slide against the internal surface 30 of the sleeve or elastic journal-bearing 16 without any danger of damage to any component of the device.

The properties of elasticity of the sleeve 16 in the radial direction serve to compensate for play in this direction between the member 20 and the shaft 15 or between said member 20 and the part which is driven by this latter.

By way of alternative, the periphery of the member 20 is uniform, that is to say without any teeth 21, and is adapted to cooperate with a roller.

It is to be noted here that the elastic sleeve-shaped journal bearing member 16 can be made of synthetic or natural rubber.

What is claimed is:

1. A selecting device for tuning a radio receiver comprising:
    a rotatable control knob;
    a shaft fastening said control knob to one end thereof;
    a cylindrical sleeve which is elastic in the radial direction, frictionally and movably mounted on said shaft;

a rigid driven member fixed to an outer surface of said sleeve for rotating between two end positions by the rotation of said knob;

a part driven by said driven member; and said sleeve absorbing radial forces and compensating for play between the shaft and the driven member, and between the driven member and the part;

the value of the coefficient of friction between the shaft and the sleeve being sufficiently high to produce a driving movement of the driven member when the member is located between its end positions and sufficiently low to produce relative rotation of the shaft in the sleeve when said driven member is stopped at an end position.

2. A device according to claim 1, wherein the sleeve is mounted within a recess of the driven member, the recess having edges for contacting a stop thereby limiting the travel of said member in rotational motion between said two end positions.

3. A device according to claim 2 wherein said shaft includes a shoulder formed along the length thereof, against which abuts a first end of said sleeve, said sleeve including a second end abutting against a transverse annular surface of said recess and further wherein the driven member includes gear means formed at its periphery for driving a mating gear means.

4. A device according to claim 1 wherein said shaft includes a shoulder formed along the length thereof, against which abuts a first end of said sleeve and wherein the latter is mounted within a recess of the driven member, and said sleeve further including a second end abutting against a transverse annular surface of said recess.

5. A device according to claim 1 wherein the driven member includes gear means formed at its periphery for driving a mating gear means.

* * * * *